(12) United States Patent  
Ratnam (10) Patent No.: US 6,456,537 B1  
(45) Date of Patent: Sep. 24, 2002

(54) TECHNIQUES FOR ERASING AN ERASABLE PROGRAMMABLE READ ONLY MEMORY (EPROM) CELL

(75) Inventor: Perumal Ratnam, Fremont, CA (US)

(73) Assignee: Alliance Semiconductor, Santa Clara, CA (US)

( * ) Notice: Subject to any disclaimer, the term of this patent is extended or adjusted under 35 U.S.C. 154(b) by 0 days.

(21) Appl. No.: 09/870,050

(22) Filed: May 29, 2001

Related U.S. Application Data

(60) Provisional application No. 60/214,598, filed on Jun. 27, 2000.

(51) Int. Cl.[7] .......................... G11C 16/04; G11C 16/06
(52) U.S. Cl. ............................ 365/185.29; 365/185.22
(58) Field of Search ........................ 365/185.22, 185.29, 365/185.33

(56) References Cited

U.S. PATENT DOCUMENTS

| | | | | | |
|---|---|---|---|---|---|
| 4,884,239 A | * | 11/1989 | Ono et al. | ............. | 365/185.09 |
| 5,650,964 A | * | 7/1997 | Chen et al. | ............. | 365/185.25 |
| 5,751,636 A | * | 5/1998 | Naruke et al. | ......... | 365/185.24 |
| 5,933,367 A | * | 8/1999 | Matsuo et al. | ......... | 365/185.18 |

* cited by examiner

Primary Examiner—Son Mai  
(74) Attorney, Agent, or Firm—Beyer Weaver & Thomas LLP (57) ABSTRACT

Techniques for improved erasing of an EPROM are described. As a method, a a drain potential of a first polarity is applied to the drain node of a selected memory cell having a first polarity concurrently with applying a gate potential of a second polarity to the gate of the selected memory cell having a second polarity. The drain and the gate polarities are then maintained until the charge has been removed from the floating gate structure of the selected memory cell as determined by a verification protocol.

15 Claims, 8 Drawing Sheets

TECHNIQUES FOR ERASING AN ERASABLE PROGRAMMABLE READ ONLY MEMORY (EPROM) CELL

CROSS REFERENCE TO RELATED APPLICATIONS

The present invention claims the benefit of U.S. Provisional Application No. 60/214,598 filed Jun. 27, 2000. This application is related to U.S. patent application Ser. No. 09/870,341, filed the same date as this application entitled "ERASABLE PROGRAMMABLE READ ONLY MEMORY (EPROM) CELL STRUCTURES HAVING DRAIN SIDE PROGRAMMING AND ERASE AND METHODS FOR FORMING SAME" by Ratnam which is incorporated by reference in its entirety for all purposes.

BACKGROUND OF THE INVENTION

1. Field of the Invention

The present invention relates generally to semiconductor memory devices and, more particularly, to an improved method and apparatus for erasing erasable programmable read-only memory devices (EPROMs).

2. Description of the Related Art

Erasable programmable read only memory (EPROM), electronically erasable programmable read only memory (EEPROM) and flash memory, in particular, are a growing class of non-volatile storage integrated circuits based on floating gate transistors. The memory cells in a flash device are formed using so called floating gate transistors in which the data is stored in a cell by charging or discharging the floating gate. The floating gate is a conductive material, typically polysilicon, which is insulated from the channel of the transistor by a thin layer of oxide, or other insulating material, and insulated from the control gate of the transistor by a second layer of insulating material.

The acts of charging and discharging the floating gate in a floating gate memory device are relatively slow compared to writing other memory types, like static or dynamic random access memory, and limit the speed with which data may be written into the device.

Two different methods of using Fowler-Nordheim tunneling are used to erase a memory cell. In channel, or substrate erase, a positive bias of about 10.0 volts is applied to the substrate of the memory cell. Similarly, a negative bias of about −5.0 volts is applied to the gate of the memory cell. Electron tunneling from the gate to the substrate then erases the memory cell by reducing the charged stored in the floating gate. Channel erase typically requires source isolation by what is referred to as a triple well process which is time consuming, complicated, and expensive. In addition, the time to erase the memory cell using the channel erase procedure is slow since the electric field across the tunnel oxide is reduced due to the low charge carrier concentration in the channel.

Source erase is similar to channel erase except that a positive bias of about 5.0 volts is applied to the source of the memory cell while a negative bias of about −10 volts is applied to the gate of the memory cell. Since source erase does not require source isolation by the triple well process it is simpler and less expensive to implement than is channel erase.

Unfortunately, however, source diode leakage during the source erase procedure lengthens the time require to fully erase an EPROM thereby degrading performance. As well known in the art, several mechanisms have been identified as contributing to the overall performance degradation caused by source diode leakage. One such mechanism is thermal leakage inherent in any tunneling process. Another is referred to as avalanche multiplication, which is electric field dependent and can become quite large if the memory cell is not properly optimized during its fabrication. A third mechanism referred to as band to band tunneling leakage is a fundamental problem with source erase and is discussed by C. Chang et al., Tech. Digest IEDM, 714, 1987 and H. Kume et al., Tech Digest IEDM, 560, 1987 each of which is incorporated by reference in its entirety.

Therefore, what is desired is an improved technique for erasing a floating gate type memory cell, such as an EPROM.

SUMMARY OF THE INVENTION

In a floating gate type semiconductor memory device such as an EPROM or a Flash EPROM, a floating gate in a floating gate transistor is erased by removing a charge stored therein. In one embodiment, the charge is removed by applying a drain potential to a drain node of a selected memory cell having a first polarity concurrently with applying a gate potential to the gate of the selected memory cell having a second polarity. The drain potential and the gate potential are maintained until the charge has been removed from the floating gate structure of the selected memory cell as determined by a verification protocol.

In those cases where the charge is a negative charge, the first polarity is negative and the second polarity is positive.

In another aspect of the invention, a source potential is applied to a source node of the selected memory cell having the first polarity concurrently with applying the gate and the drain potential. The source polarity is maintained until the charge has been removed from the floating gate structure of the selected memory cell as determined by the verification protocol.

In yet another aspect of the invention, a system for erasing a memory cell is disclosed. The memory cell having a gate node coupled to a gate structure, a source node coupled to a source structure, a drain node coupled to a drain structure, wherein a floating gate structure is disposed between the gate structure and the source structure and the drain structure such that a charge is stored in the floating gate structure when the memory cell is programmed and wherein the charged is removed from the floating gate structure when the memory cell is erased. The system includes an address selector unit arranged to select the memory cell and a first potential generator coupled to the memory cell suitably arranged to apply a drain potential to the drain node of the selected memory cell having a first polarity. The system also includes a second potential generator coupled to the memory cell and in communication with the first potential generator arranged to concurrently with the first potential generator to apply a gate potential to the gate of the selected memory cell having a second polarity. The system further includes a verifier unit arranged to verify that the memory cell has been erased such that the first potential generator and the second potential generator maintain the drain potential and the gate potential at their respective potentials until the charge has been removed from the floating gate structure of the selected memory cell as determined by a verification protocol.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The following description is provided to enable any person skilled in the art to make and use the invention and sets forth the best modes contemplated by the inventor for carrying out the invention. Various modifications, however, will remain readily apparent to those skilled in the art, since the basic principles of the present invention have been defined herein specifically to provide a novel erase protocol for an EPROM memory cell.

Reference will now be made in detail to a preferred embodiment of the invention. An example of the preferred embodiment is illustrated in the accompanying drawings. While the invention will be described in conjunction with a preferred embodiment, it will be understood that it is not intended to limit the invention to one preferred embodiment. To the contrary, it is intended to cover alternatives, modifications, and equivalents as may be included within the spirit and scope of the invention as defined by the appended claims.

In an EPROM memory cell having a source, a gate, and a drain, conventional EPROM program and erase protocols rely on Fowler-Nordheim tunneling of electrons through a thin source side oxide layer. Typically, the source is optimized for programming the EPROM memory cell, which unfortunately results in less than optimal erase characteristics and performance. In order to improve erasing, therefore, the invention contemplates a drain side erase protocol in which the erase characteristics of the EPROM memory cell are enhanced.

By using the drain-gate oxide boundary, or the combination of the source-gate oxide boundary and the drain-gate oxide boundary as a path for hot electron injection, the time require to either program or erase a particular EPROM memory cell is substantially reduced over conventional approaches to EPROM programming and erasing. In addition, since the drain-gate oxide boundary is primarily used for hot electron injection in either case, the size of the memory cell can be readily reduced thereby increasing the density of those memory arrays that utilize a common source type architecture.

Figure 1A:
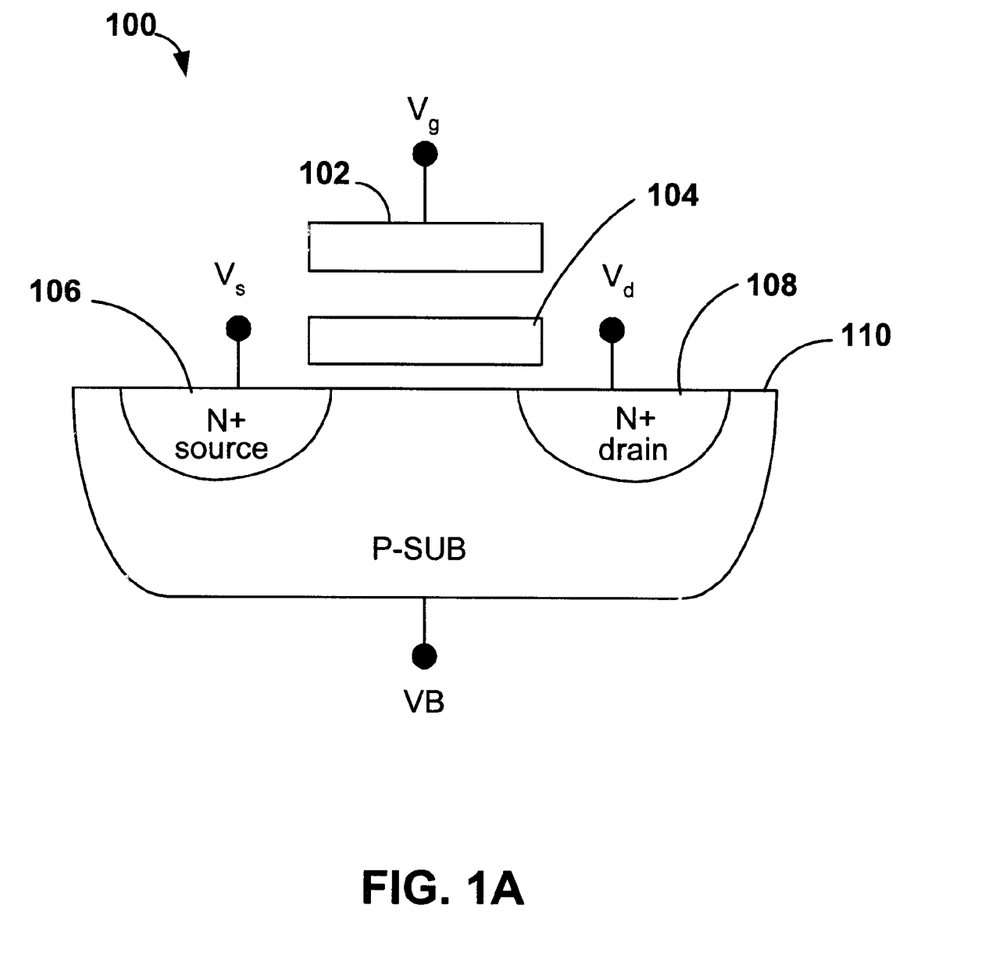
FIGS. 1A–1B are schematic diagrams of an EPROM memory cell transistor according to the present invention.
Figure 1B:
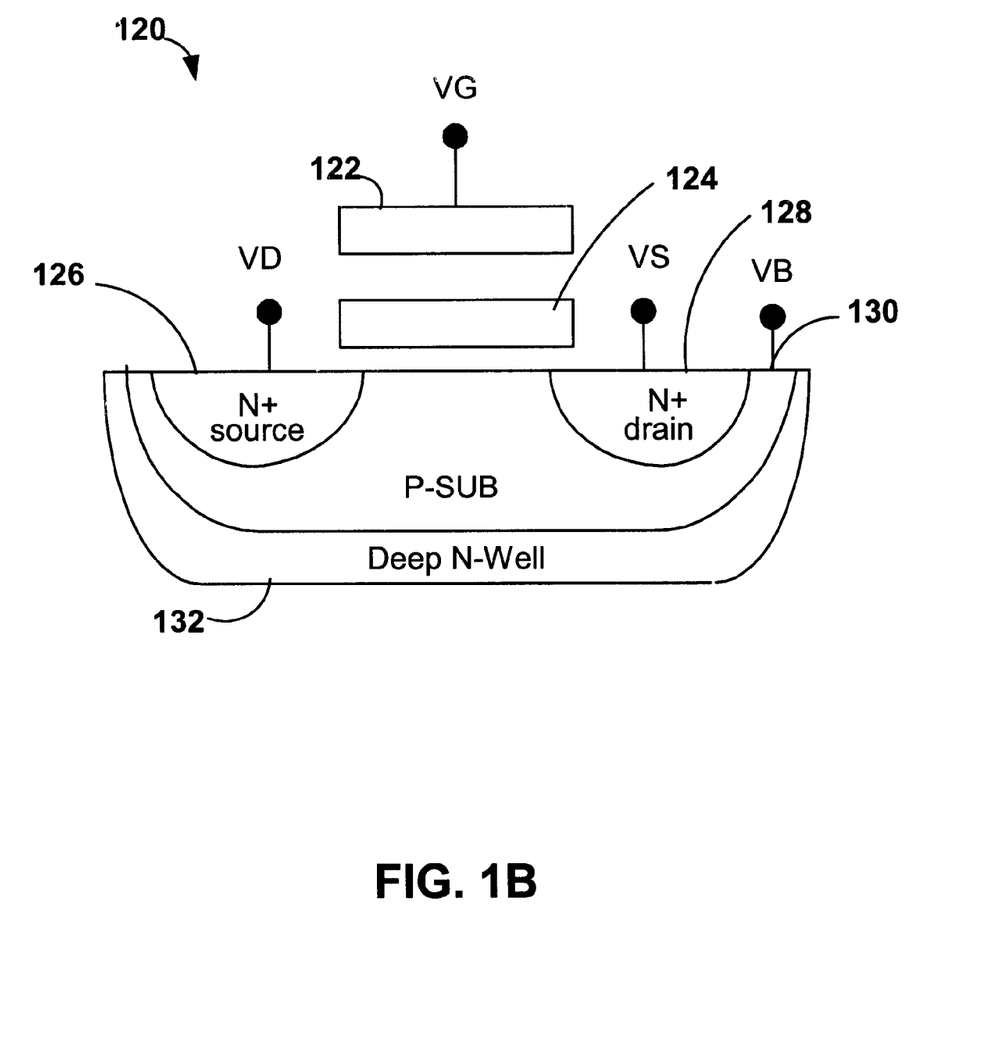

FIGS. 1A–1B show alternate embodiments of an EPROM memory cell suitable for use in an integrated circuit memory, according to the current invention. It should be noted that for sake of the remainder of this discussion, the EPROM memory cell 100 is a flash memory cell suitable for storing data in a non-volatile manner in a flash memory device. As shown in FIG. 1A, the flash memory cell 100 includes a control gate 102, a floating gate 104, bit line diffusions 106–108 (forming, respectively, the source and drain of the flash memory cell 100) and a substrate 110. The flash memory cell 100 is suitable for use in a memory array, such as that discussed above in connection with FIG. 3.

FIG. 1B shows an alternate embodiment of a flash memory cell 120. The flash memory cell 120 that includes a control gate 122, a floating gate 124, source and drain bit lines, respectively, 126–128, a substrate well 130 and a deep N well 132 forming what is referred to as a triple well type device. It should be noted that this triple well device allows for low voltage applications when negative voltages are applied to the substrate 130.

Figure 2A:
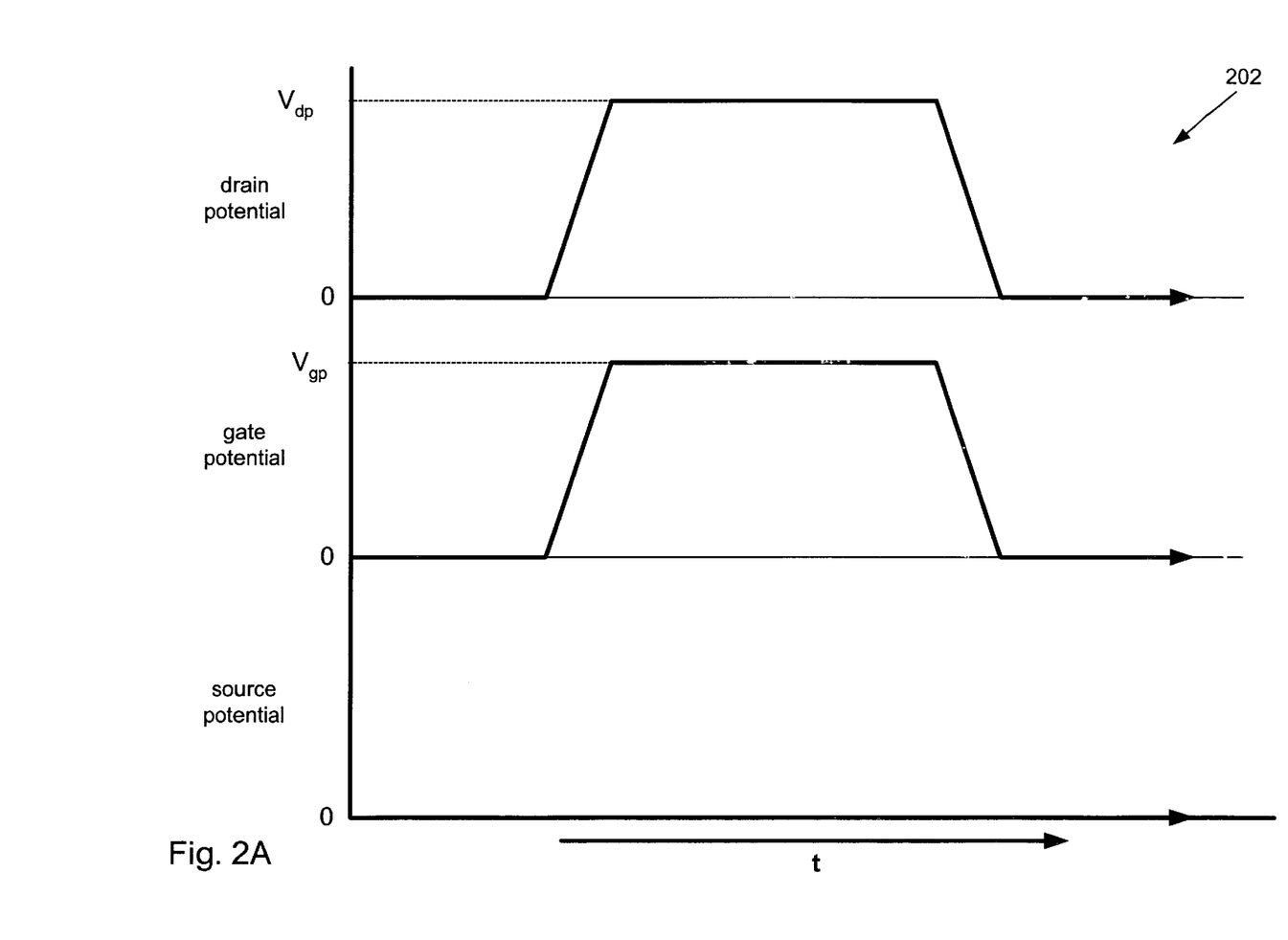
FIG. 2A is a timing/voltage diagram of a programming cycle of the EPROM shown in FIGS. 1A–1B according to the present invention.

FIG. 2A is a drain-side programming timing-voltage waveform 202 illustrating a programming protocol in accordance with an embodiment of the invention. As shown in FIG. 2A, during a programming cycle, the drain 108 of the memory cell 100 is raised to a positive potential $V_{dp}$ concurrently with the control gate 102 being raised to a positive potential $V_{gp}$ thereby facilitating the flow of electrons from the drain 108 to the floating gate 104. It should be noted that the source 106 of the cell 100 is grounded during the programming cycle. Typically, the drain potential $V_{dp}$ is approximately +5.0 volts while the gate potential $V_{gp}$ is approximately +5.0 volts during the programming cycle.

Figure 2B:
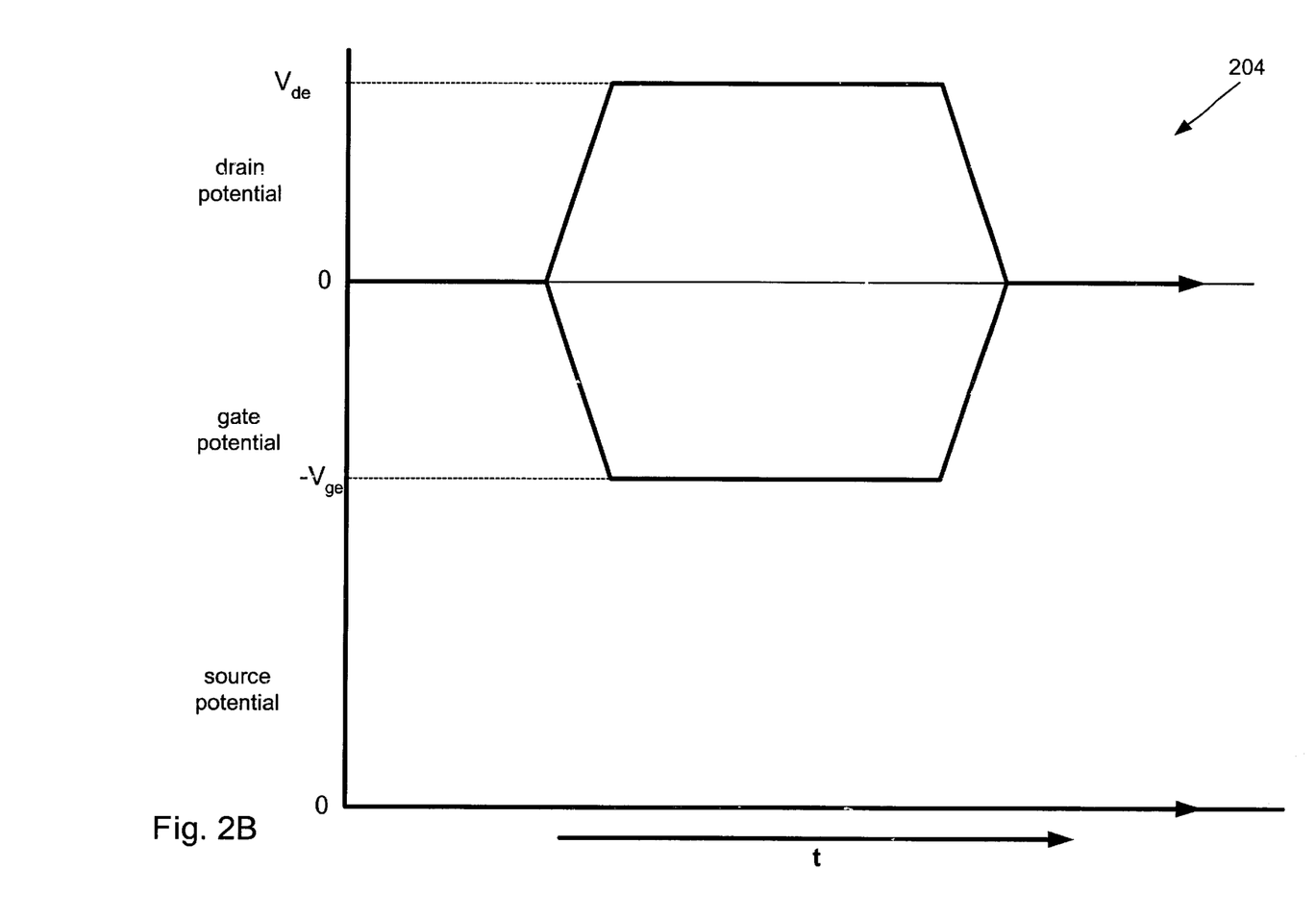
FIG. 2B is a timing/voltage diagram of a drain erase cycle of the EPROM shown in FIGS. 1A–1B in accordance with an embodiment of the invention.

FIG. 2B shows a drain side erase timing-voltage waveform 204 in accordance with an embodiment of the invention. During an erase cycle, the drain 108 is raised to a positive potential $V_{dc}$ whereas a negative potential $(-V_{ge})$ is applied to the control gate 102. During the erase cycle 204, the source 106 can float (i.e., no applied potential) or be held at approximately 0 volts.

Figure 2C:
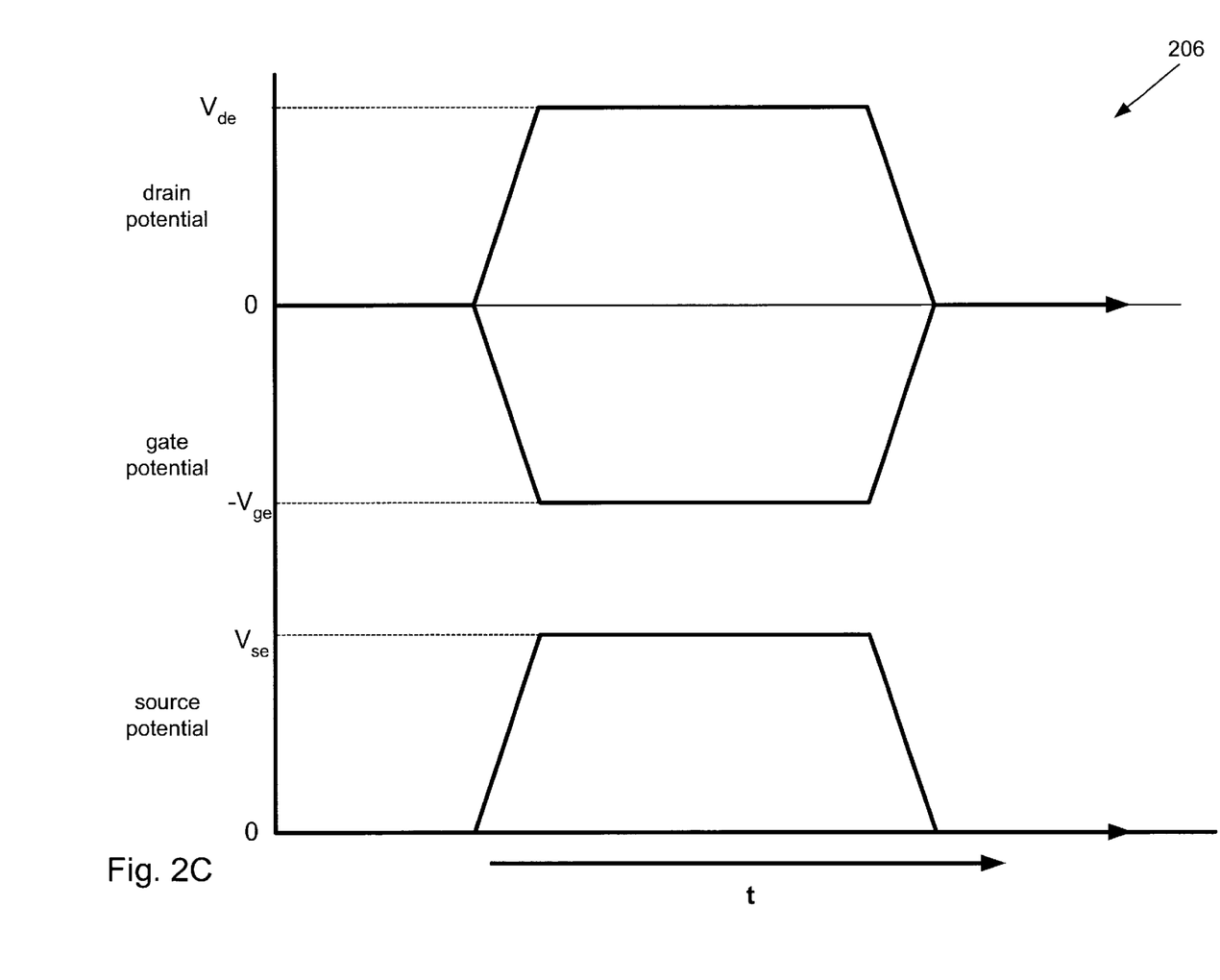
FIG. 2C is a timing/voltage diagram of a drain-source erase cycle of the EPROM shown in FIGS. 1A–1B in accordance with an embodiment of the invention.

FIG. 2C shows a drain/source erase timing-voltage waveform of a drain-source erase cycle 206 in accordance with an embodiment of the invention. During the drain-source cycle 206, the drain 108 is raised to a positive potential $V_d$, concurrently with the source 106 being raised to a positive source potential $V_{se}$ whereas a negative potential $(-V_{ge})$ is applied to the control gate 102. In this way, the floating gate 104 can be discharged through both the floating gate/drain junction as well as the floating gate/source junction resulting in a substantial improvement in overall erase performance as illustrated in Table 1. It should be noted that in the described embodiments, $V_{se}$ is typically +5.0 volts whereas $V_{ge}$ is typically +10 volts.

It should be noted that during the program cycle, the substrate 108 can be either held at ground or at a negative substrate voltage $(-V_{subp})$ whereas during the erase cycles 204 and 206, the substrate 108 can be either held at ground or connected directly to the drain 108.

Figure 3:
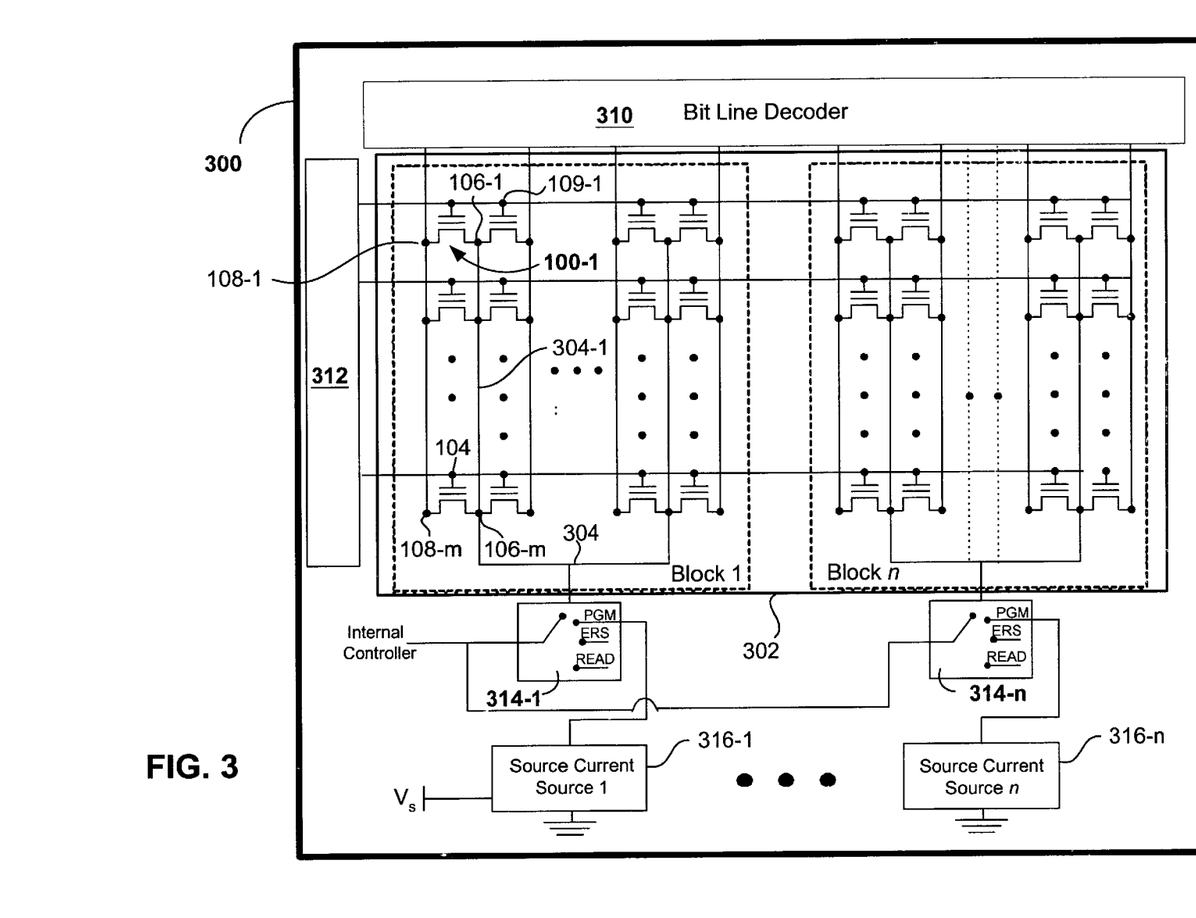
FIG. 3 shows an integrated circuit memory chip implementing an embodiment of the current invention.

FIG. 3 shows an integrated circuit memory chip 300 implementing an embodiment of the current invention. The memory chip 300 includes a memory array 302 that includes a memory array block 1 through a memory array block n, each of which includes j x m memory cells 100 arranged in j columns and m rows. In the embodiment shown, a common source architecture is set forth, in which all the memory cells of a particular block share a common source line. For example, in the block 1, memory cells 100-1 through 100-m each have a source 106-1 through 106-m, respectively, which share a common source line 304-1.

In the embodiment shown and described, the blocks 1 through n are themselves accessed via a bit line decoder 310 and a word line decoder 312. The common source line 304-1 in the memory block 1 is coupled to an internal controller 314-1. The internal controller 314-1, in the embodiment shown, is a multi-poll switch, which during the programming phase of operation couples the common source line 304-1 in the block 1 to ground via a source current component 316-1 in much the same way as a common source line 106-n of the memory block n is coupled to ground by way of an internal controller 314-n. In the embodiment shown, there is one source bias component for each memory block of the memory array 302 that is located generally on the same portion of the chip 300 as is its corresponding memory block. Because the source bias component is distributed across the chip 300 in general proximity to the memory block to which it is switchably coupled, it is able to remove voltage distribution due to process variations on a single chip during the programming cycle. It should be noted that when the chip 300 is a flash memory device, then all the memory cells included in a particular memory segment are erased substantially simultaneously as opposed to a non-flash memory device in which the memory array 302 is erased on a bit-wise basis.

In order to erase the memory cell 100-1 in the block 1, for example, using the drain/source erase timing-voltage waveform shown in FIG. 2C, a row address/column address signal is sent to the chip 300 appropriately encoded to select the particular memory cell to be erased, which in this example, is the memory cell 100-n included in the block 1. The address signal is decoded into a column select signal and a row select signal 106-1 used by the bit line decoder 310 and word line decoder 312, respectively, to select the memory cell 100-1. Once selected, the internal controller 314-1 couples the source line 304-1 to the source current source 1 316-1 which provides the source potential $V_{se}$ at the gate 104-1. Concurrently, the drain potential $V_{de}$ is applied to the drain 108-m and the gate potential $-V_{ge}$ are provided by the bit line decoder 310 and word line decoder 312, respectively until such time as the memory cell 100-m is substantially erased as determined by a verification protocol well known in the art.

In the case of a flash memory, the entire memory block 1, or a designated portion thereof, is erased at approximately the same time since the memory cells 100 in the memory block 1 (or designated portion) are concurrently selected and erased during a single erase cycle.

Figure 4:
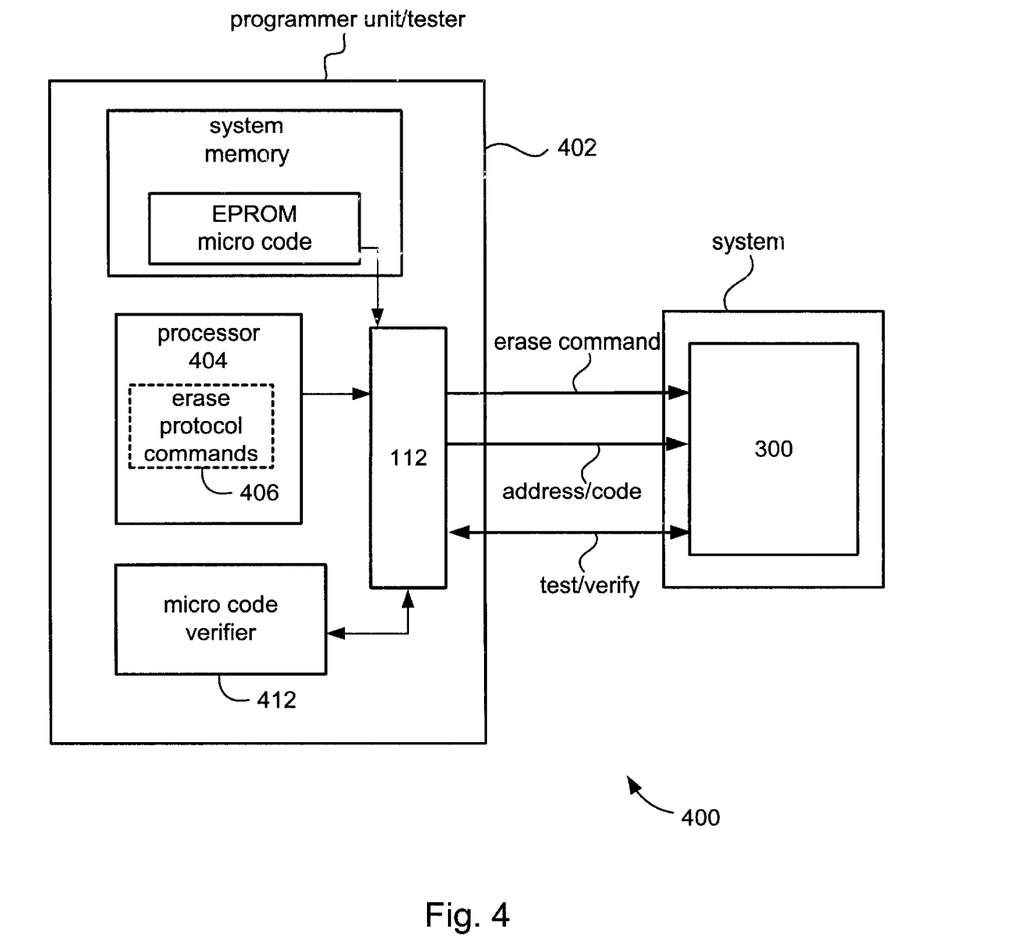
FIG. 4 illustrates a system suitable for programming and erasing a memory cell in accordance with an embodiment of the invention.

In most applications, the chip 300 is part of a system 400 as illustrated in FIG. 4 showing a tester 402 arranged to program and erase the chip 300 in accordance with an embodiment of the invention. In order to program the chip 300 with, for example, a microcode, a processor 404 coupled to the tester 402 directs a controller 406 to retrieve appropriate microcode 408 that is stored in a system memory 410. Once the appropriate microcode has been retrieved, the processor 404 sends what is referred to as a system command to the controller 406 that includes an erase command in order to erase the entire chip 300, or portions thereof. In the described embodiment, the erase command can take the form of the erase cycle described in FIGS. 2B and/or 2C using either a drain side erase or a drain-source erase protocol. Once the erase operation has been completed and verified by a verifier 412, the processor directs the controller 406 to send a program command that includes the address location in the chip 300 to be programmed along with the appropriate binary code.

Figure 5:
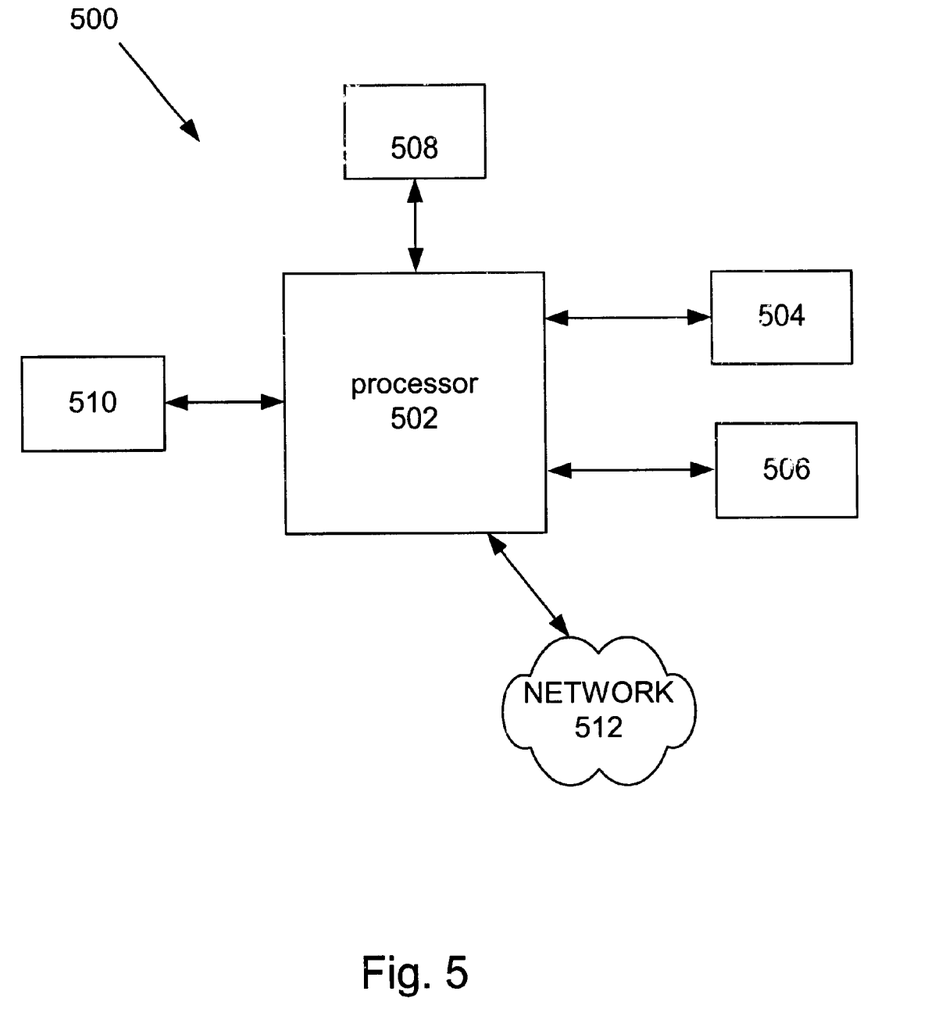
FIG. 5 illustrates a typical, general-purpose computer system suitable for implementing the programmer/tester described in FIG. 4

FIG. 5 illustrates a typical, general-purpose computer system 500 suitable for implementing the programmer/tester 402 described in FIG. 4. The computer system 500 includes any number of processors 502 (also referred to as central processing units, or CPUs) that are coupled to memory devices including primary storage devices 504 (typically a read only memory, or ROM) and primary storage devices 506 (typically a random access memory, or RAM).

As is well known in the art, ROM acts to transfer data and instructions uni-directionally to the CPUs 502, while RAM is used typically to transfer data and instructions in a bi-directional manner. CPUs 502 may generally include any number of processors. Both primary storage devices 504, 506 may include any suitable computer-readable media. A secondary storage medium 508, which is typically a mass memory device, is also coupled bi-directionally to CPUs 502 and provides additional data storage capacity. The mass memory device 508 is a computer-readable medium that may be used to store programs including computer code, data, and the like. Typically, mass memory device 508 is a storage medium such as a hard disk or a tape which generally slower than primary storage devices 504, 506. Mass memory storage device 508 may take the form of a magnetic or paper tape reader or some other well-known device. It will be appreciated that the information retained within the mass memory device 508, may, in appropriate cases, be incorporated in standard fashion as part of RAM 506 as virtual memory. A specific primary storage device 504 such as a CD-ROM may also pass data uni-directionally to the CPUs 502.

CPUs 502 are also coupled to one or more input/output devices 510 that may include, but are not limited to, devices such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPUs 502 optionally may be coupled to a computer or telecommunications network, e.g., an internet network or an intranet network, using a network connection as shown generally at 512. With such a network connection, it is contemplated that the CPUs 502 might receive information from the network, or might output information to the network in the course of performing the above-described method steps. Such information, which is often represented as a sequence of instructions to be executed using CPUs 502, may be received from and outputted to the network, for example, in the form of a computer data signal embodied in a carrier wave. The above-described devices and materials will be familiar to those of skill in the computer hardware and software arts.

Although the foregoing invention has been described in some detail for purposes of clarity of understanding, it will be apparent that certain changes and modifications may be practiced within the scope of the appended claims. Furthermore, it should be noted that there are alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A method of erasing a memory cell having a gate node coupled to a gate structure, a source node coupled to a source structure, a drain node coupled to a drain structure, wherein a floating gate structure is disposed between the gate structure and the source structure and the drain structure such that a charge is stored in the floating gate structure when the memory cell is programmed and wherein the charged is removed from the floating gate structure when the memory cell is erased, comprising:

in an erase cycle, (a) selecting the memory cell;

(b) applying a drain potential to the drain node of the selected memory cell having a first polarity and applying a source potential to the source node of the selected memory cell having the first polarity;

(c) concurrently with (b), applying a gate potential to the gate of the selected memory cell having a second polarity; and (d) maintaining the drain potential and the gate potential until the charge has been removed from the floating gate structure of the selected memory cell as determined by a verification protocol.

2. A method as recited in claim 1, wherein when the charge is a negative charge, then the first polarity is a positive polarity and the second polarity is a negative polarity.

3. A method as recited in claim 1, wherein the floating gate structure is separated from the gate structure by a first insulator layer and wherein the floating gate structure is separated from the drain structure and the source structure by a second insulator layer.

4. A method as recited in claim 1, wherein the floating gate structure is formed of polysilicon.

5. A method as recited in claim 1, wherein the memory cell is one of a plurality of memory cells, wherein the plurality of memory cells is arranged in rows and columns to form an array of memory cells.

6. A method as recited in claim 6, wherein the array of memory cells is included in a integrated circuit, wherein the integrated circuit includes a row decoder coupled to the memory array arranged to select a particular row of memory cells based upon a row select signal and a column decoder coupled to the array of memory cells arranged to select a column of memory cells based upon a column select signal.

7. A method as recited in claim 6, wherein the selecting (a) comprises:

(f) receiving the row select signal at the row decoder;

(g) receiving the column select signal at the column decoder;

(h) decoding the row select and the column select signal by the row decoder and the column decoder, respectively, to form a decoded memory address; and (i) selecting the memory cell associated with the decoded memory address.

8. A method a recited in claim 6, wherein when the integrated circuit is a flash memory type integrated circuit, then the selecting (a) selects the plurality of memory cells concurrently such that each of the plurality of memory cells so selected are erased substantially simultaneously.

9. A method as recited in claim 1, wherein the memory cell is an erasable programmable read only memory (EPROM) type memory cell.

10. A system for erasing a memory cell having a gate node coupled to a gate structure, a source node coupled to a source structure, a drain node coupled to a drain structure, wherein a floating gate structure is disposed between the gate structure and the source structure and the drain structure such that a charge is stored in the floating gate structure when the memory cell is programmed and wherein the charged is removed from the floating gate structure when the memory cell is erased, comprising:

in an erase cycle, an address selector unit arranged to select the memory cell;

a first potential generator coupled to the memory cell suitably arranged to apply a drain potential to the drain node of the selected memory cell having a first polarity and a source potential to the source node of the selected memory cell having the first polarity;

a second potential generator coupled to the memory cell and in communication with the first potential generator arranged to concurrently with the first potential generator to apply a gate potential to the gate of the selected memory cell having a second polarity; and a verifier unit arranged to verify that the memory cell has been erased such that the first potential generator and the second potential generator maintain the drain potential and the gate potential at their respective potentials until the charge has been removed from the floating gate structure of the selected memory cell as determined by a verification protocol.

11. An apparatus for erasing a memory cell, comprising:

a means for selecting the memory cell;

a means for applying a drain potential to a drain node of the selected memory cell having a first polarity and a source potential to the source node of the selected memory cell having the first polarity;

a means for concurrently applying a gate potential to a gate of the selected memory cell having a second polarity; and a means for maintaining the drain potential, the source potential and the gate potential until a programming charge has been removed from a floating gate structure of the selected memory cell as determined by a verification protocol.

12. An apparatus as recited in claim 11, wherein when the programming charge is a negative charge, then the first polarity is a positive polarity and the second polarity is a negative polarity.

13. A method as recited in claim 11, wherein the floating gate structure is separated from the gate structure by a first insulator layer and wherein the floating gate structure is separated from the drain structure and the source structure by a second insulator layer.

14. A method as recited in claim 11, wherein the floating gate structure is formed of polysilicon.

15. A method as recited in claim 11, wherein the memory cell is one of a plurality of memory cells, wherein the plurality of memory cells is arranged in rows and columns to form an array of memory cells.

* * * * *